United States Patent
Sengupta et al.

(10) Patent No.: US 9,731,959 B2
(45) Date of Patent: Aug. 15, 2017

(54) INTEGRATED DEVICE PACKAGES HAVING A MEMS DIE SEALED IN A CAVITY BY A PROCESSOR DIE AND METHOD OF MANUFACTURING THE SAME

(71) Applicant: ANALOG DEVICES, INC., Norwood, MA (US)

(72) Inventors: Dipak Sengupta, Boxborough, MA (US); Shafi Saiyed, Lynnfield, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/554,661

(22) Filed: Nov. 26, 2014

(65) Prior Publication Data

US 2016/0090298 A1    Mar. 31, 2016

Related U.S. Application Data

(60) Provisional application No. 62/055,435, filed on Sep. 25, 2014.

(51) Int. Cl.
*B81B 7/00* (2006.01)
*B81C 1/00* (2006.01)

(52) U.S. Cl.
CPC ................. *B81B 7/0048* (2013.01)

(58) Field of Classification Search
CPC ...... B81B 7/0051; B81B 7/008; B81C 1/0023
See application file for complete search history.

(56) References Cited

U.S. PATENT DOCUMENTS

| 4,303,934 | A |   | 12/1981 | Stitt |              |
|-----------|---|---|---------|-------|--------------|
| 4,539,622 | A | * | 9/1985  | Akasaki | H01L 23/057 156/89.21 |
| 4,608,592 | A | * | 8/1986  | Miyamoto | H01L 23/057 174/541 |
| 5,237,204 | A | * | 8/1993  | Val   | H01L 23/057 257/691 |
| 5,247,597 | A |   | 9/1993  | Blacha et al. |     |
| 5,293,069 | A | * | 3/1994  | Kato  | H01L 23/04 257/691 |
| 5,689,091 | A | * | 11/1997 | Hamzehdoost | H01L 23/3121 174/255 |
| 6,084,308 | A |   | 7/2000  | Kelkar et al. |     |
| 6,326,611 | B1|   | 12/2001 | Kennedy et al. |    |

(Continued)

OTHER PUBLICATIONS

European Search Report dated Oct. 16, 2015 issued in EP Application No. 14152487.6 in 6 pages.

(Continued)

*Primary Examiner* — Marc Armand
*Assistant Examiner* — Younes Boulghassoul
(74) *Attorney, Agent, or Firm* — Knobbe, Martens, Olson & Bear LLP

(57) ABSTRACT

An integrated device package is disclosed. The package includes a substrate comprising a cavity through a top surface of the substrate. A first integrated device die is positioned in the cavity. The first integrated device die includes one or more active components. A second integrated device die is attached to the top surface of the substrate and positioned over the cavity. The second integrated device die covers the cavity. Encapsulant can cover the second integrate device die.

18 Claims, 7 Drawing Sheets

(56) References Cited

U.S. PATENT DOCUMENTS

| | | | |
|---|---|---|---|
| 6,388,336 B1 | 5/2002 | Venkateshwaran et al. | |
| 6,489,686 B2 | 12/2002 | Farooq et al. | |
| 6,490,161 B1 | 12/2002 | Johnson | |
| 6,528,869 B1 * | 3/2003 | Glenn | H01L 21/4853 219/209 |
| 6,528,875 B1 * | 3/2003 | Glenn | B81B 7/007 257/701 |
| 6,777,789 B1 | 8/2004 | Glenn et al. | |
| 6,787,916 B2 | 9/2004 | Halahan | |
| 6,821,817 B1 | 11/2004 | Thamby et al. | |
| 6,890,798 B2 * | 5/2005 | McMahon | H01L 23/49833 257/E23.063 |
| 7,209,362 B2 | 4/2007 | Bando | |
| 7,224,058 B2 * | 5/2007 | Fernandez | H01L 23/13 257/707 |
| 7,408,244 B2 | 8/2008 | Lee et al. | |
| 7,411,281 B2 | 8/2008 | Zhang | |
| 7,489,025 B2 | 2/2009 | Chen et al. | |
| 7,619,303 B2 | 11/2009 | Bayan | |
| 7,858,437 B2 | 12/2010 | Jung et al. | |
| 8,080,925 B2 | 12/2011 | Berger et al. | |
| 8,115,307 B2 | 2/2012 | Toyama et al. | |
| 8,399,994 B2 | 3/2013 | Roh et al. | |
| 8,653,635 B2 | 2/2014 | Gowda et al. | |
| 8,842,951 B2 | 9/2014 | Doscher et al. | |
| 9,156,673 B2 * | 10/2015 | Bryzek | H01L 29/84 |
| 9,195,055 B2 * | 11/2015 | Oberst | B81B 7/007 |
| 2002/0090749 A1 | 7/2002 | Simmons et al. | |
| 2003/0104651 A1 * | 6/2003 | Kim | B81C 1/00269 438/106 |
| 2004/0007750 A1 | 1/2004 | Anderson et al. | |
| 2004/0041248 A1 * | 3/2004 | Harney | B81B 7/0048 257/684 |
| 2004/0173913 A1 * | 9/2004 | Ohta | G01P 1/023 257/777 |
| 2005/0046003 A1 | 3/2005 | Tsai | |
| 2005/0101161 A1 | 5/2005 | Weiblen et al. | |
| 2005/0285239 A1 | 12/2005 | Tsai et al. | |
| 2006/0261453 A1 | 11/2006 | Lee et al. | |
| 2009/0032926 A1 * | 2/2009 | Sharifi | H01L 23/13 257/686 |
| 2009/0070727 A1 | 3/2009 | Solomon | |
| 2009/0282917 A1 | 11/2009 | Acar | |
| 2010/0019393 A1 | 1/2010 | Hsieh et al. | |
| 2010/0133629 A1 | 6/2010 | Zhang et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2011/0024899 A1 | 2/2011 | Masumoto et al. | |
| 2011/0062572 A1 | 3/2011 | Steijer et al. | |
| 2011/0133847 A1 | 6/2011 | Ogura et al. | |
| 2012/0027234 A1 | 2/2012 | Goida | |
| 2013/0032388 A1 | 2/2013 | Lin et al. | |
| 2013/0069218 A1 * | 3/2013 | Seah | H01L 25/03 257/712 |
| 2014/0027867 A1 * | 1/2014 | Goida | H01L 23/5389 257/416 |
| 2014/0191419 A1 | 7/2014 | Mallik et al. | |
| 2014/0217566 A1 | 8/2014 | Goida et al. | |
| 2014/0252569 A1 * | 9/2014 | Ikuma | H01L 23/66 257/659 |
| 2015/0210538 A1 * | 7/2015 | Su | G02B 27/0006 359/514 |
| 2016/0046483 A1 * | 2/2016 | Cheng | B81B 7/008 257/692 |
| 2016/0167951 A1 | 6/2016 | Goida et al. | |

OTHER PUBLICATIONS

Kim et al., "Multi-flip chip on lead frame overmolded IC package: A novel packaging design to achieve high performance and cost effective module package," Electronic Components and Technology Conference, 2005, pp. 1819-1821.

European Search Report issued Sep. 29, 2015 in European Patent Application No. 14152487.6 filed Jan. 24, 2014, in 5 pages.

* cited by examiner

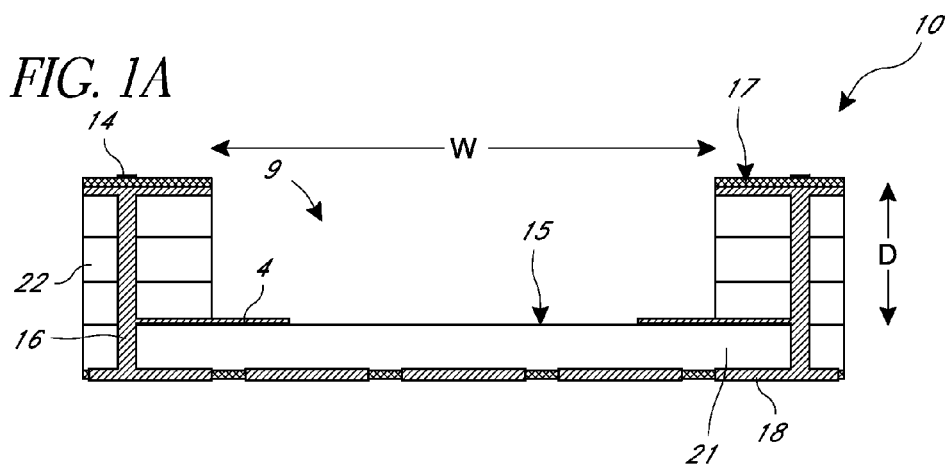
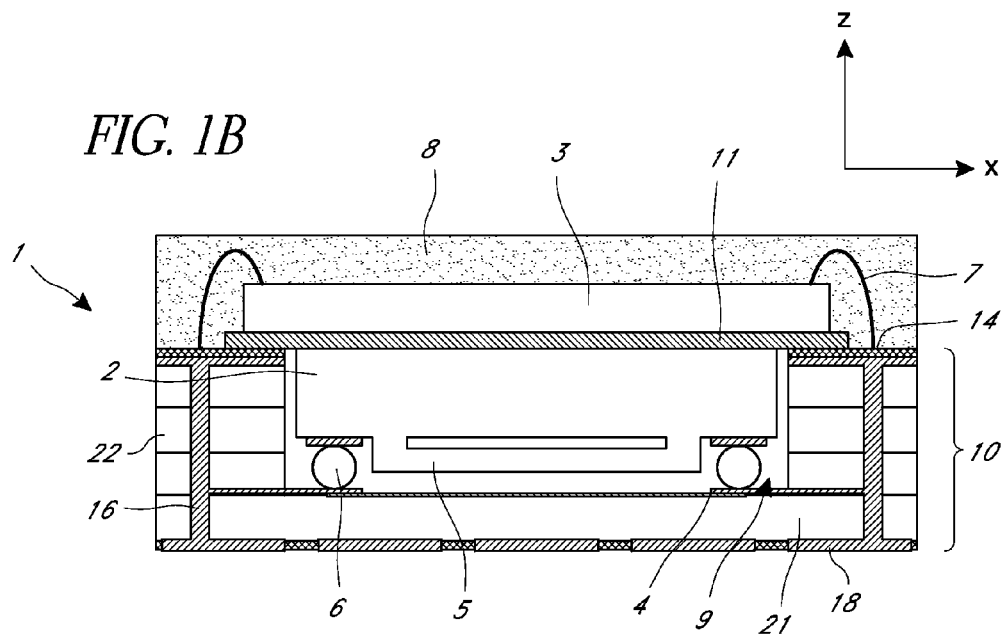

INTEGRATED DEVICE PACKAGES HAVING A MEMS DIE SEALED IN A CAVITY BY A PROCESSOR DIE AND METHOD OF MANUFACTURING THE SAME

CROSS-REFERENCE TO RELATED APPLICATIONS

This application claims priority to U.S. Provisional Patent Application No. 62/055,435, filed Sep. 25, 2014, entitled "PACKAGES FOR STRESS-SENSITIVE DEVICE DIES," the contents of which are incorporated by reference herein in its entirety and for all purposes.

BACKGROUND

Field

The field relates to apparatus and methods for packaging, and in particular, to apparatus and methods for packaging stress-sensitive device dies.

Description of the Related Art

Electronic devices often include packages that have one or more integrated device dies that are sensitive to stresses induced during manufacturing, assembly, transportation, and/or use. Stresses may cause the device die to warp and/or may damage components formed in or on the die. In some cases, when an encapsulant or molding material is applied over a die, the moisture content and material properties of the encapsulant can change throughout the life of the package. Changing moisture content can cause the encapsulant to swell or otherwise deform, which can damage the integrated device die or change the stresses experienced by the die over its working life. Similarly, changing temperature can change the material properties of the encapsulant which can impart stresses on the die surface. For example, various types of microelectromechanical systems (MEMS) dies may include components that are sensitive to such stresses. In some arrangements, a MEMS accelerometer die or a MEMS pressure sensor die may include various mechanical components, such as beams, that may be damaged if subjected to sufficiently high stresses. In other examples, dies with absolute outputs, such as voltage reference circuits, can be sensitive to the stresses of encapsulants. Also, dies used for various types of precision amplifier, reference or converter products may be also be susceptible to encapsulant stresses. Accordingly, there is a continuing need for improved packaging arrangements for stress-sensitive device dies.

SUMMARY

In one embodiment, an integrated device package is disclosed. The package can include a substrate comprising a cavity through a top surface of the substrate. A first integrated device die can be positioned in the cavity. The first integrated device die can comprise one or more active components. A second integrated device die can be attached to the top surface of the substrate and positioned over the cavity. The second integrated device die can cover the cavity.

In another embodiment, a method for manufacturing an integrated device package is disclosed. The method can include providing a substrate comprising a cavity through a top surface of the substrate. The method can include positioning a first integrated device die in the cavity. The first integrated device die can comprise one or more active components. The method can include positioning a second integrated device die over the cavity. The method can include attaching the second integrated device die to the top surface of the substrate to cover the cavity.

In yet another embodiment, an integrated device package is disclosed. The package can include a substrate comprising a cavity. The package can include an integrated device die disposed in the cavity. An encapsulant can be disposed over at least a portion of a top surface of the substrate. The encapsulant does not contact at least an active side of the integrated device die.

For purposes of summarizing embodiments and the advantages achieved over the prior art, certain objects and advantages have been described herein above. Of course, it is to be understood that not necessarily all such objects or advantages may be achieved in accordance with any particular embodiment of the invention. Thus, for example, those skilled in the art will recognize that embodiments may achieve or optimize one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the present disclosure not being limited to any particular preferred embodiment(s) disclosed.

BRIEF DESCRIPTION OF THE DRAWINGS

These aspects and others will be apparent from the following description of preferred embodiments and the accompanying drawings, which are meant to illustrate and not to limit the present disclosure, wherein:

FIG. 1A is a schematic side cross-sectional view of a substrate including a cavity through a top surface of the substrate, according to one embodiment.

FIG. 1B is a schematic side cross-sectional view of an integrated device package that includes the substrate of FIG. 1A.

DETAILED DESCRIPTION

Figure 2A:
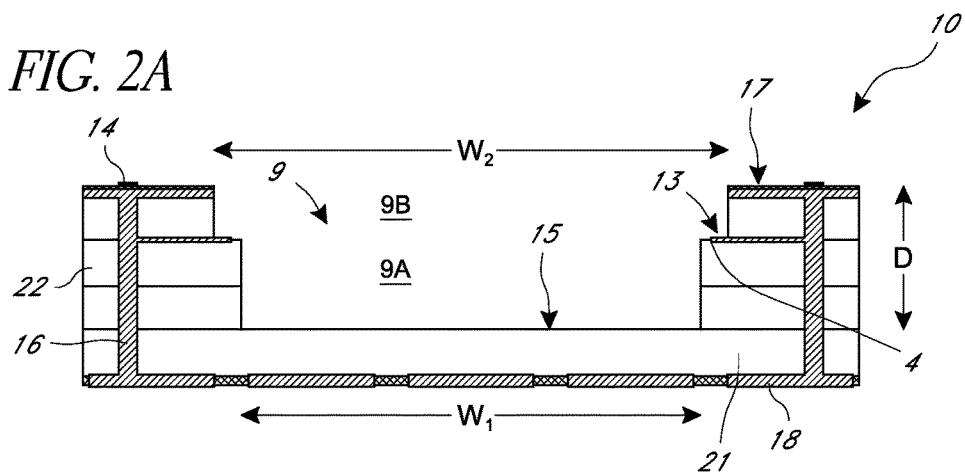
FIG. 2A is a schematic side cross-sectional view of a substrate including a cavity through a top surface of the substrate and having a lower portion and an upper portion, according to another embodiment.

The following detail description of certain embodiments presents various descriptions of specific embodiments of the invention. However, the invention can be embodied in myriad different ways as defined and covered by the claims. In this description, reference is made to the drawings where like reference numerals indicate identical or functionally similar elements. The drawings are schematic and not to scale.

Various embodiments herein relate to packaging arrangements in which one or more stress sensitive dies can be positioned such that strain induced in the dies by external stresses are reduced or eliminated. The disclosed embodiments can reduce such stresses at lower manufacturing and/or assembly costs as compared with other techniques, such as those utilizing a metal lid and cavity. Embodiments can achieve advantages of encapsulation without some disadvantages thereof. The packages disclosed herein can include any suitable number and type of device dies. For example, in some embodiments, a first integrated device die can be disposed in a cavity through a top surface of a package substrate. A second integrated device die can be attached to the top surface of the substrate and can be positioned over the cavity such that the second integrated device die covers the cavity, e.g., completely covers the opening defined by the cavity. In some arrangements, the second integrated device die can seal the cavity and the first integrated device die from the outside environs. In various embodiments, an encapsulant or molding material can be disposed over the second integrated device die and a portion of the top surface of the substrate. As explained herein, the use of an encapsulant or molding material can reduce manufacturing and/or assembly costs relative to implementations that use a metal lid or other covering structure.

The first and second device dies can be any suitable device die. In some embodiments, the first integrated device die can comprise a stress-sensitive die, such as a microelectromechanical systems (MEMS) die. For example, the first integrated device die can comprise a MEMS accelerometer, gyroscope, or any other suitable type of device die. In another example, the first integrated device die can comprise a voltage reference circuit. The second integrated device die can comprise a processor die in some arrangements and can electrically communicate with the first integrated device die. By sealing or covering the cavity in which the first integrated device die is disposed, the package can advantageously protect the first integrated device die from stresses that may be imparted on the first die.

FIG. 1A is a schematic side cross-sectional view of a substrate 10 including a cavity 9 through a top surface 17 of the substrate 10, according to one embodiment. The substrate 10 shown in FIG. 1A is a printed circuit board (PCB) substrate which may comprise FR-4 board (or Bismaleimide-Triazine (BT) or similar material) and a metal such as copper for conductive traces. In other embodiments, the substrate 10 can comprise another type of package substrate, such as a molded plastic substrate with embedded traces, a ceramic substrate, etc. In the embodiment of FIG. 1A, the cavity 9 may comprise a recess formed or defined through the top surface 17 of the substrate 10. The substrate 10 can comprise a base portion 21 and one or more wall(s) 22 extending transverse to the base portion 21. The wall(s) 22 can be integrally formed with or attached to (e.g., adhered or mechanically coupled to) the base portion 21 in various arrangements, and the cavity can be defined at least in part by the base portion 21 and the wall(s) 22. For example, the cavity 9 can be formed by any suitable process, such as mechanical milling, laser etching, chemical etching, etc.

As shown in FIG. 1A, the cavity 9 can be defined such that the cavity 9 exposes one or more conductive lands 4 on a floor 15 of the cavity 9. The conductive lands 4 can electrically communicate with other portions of the substrate 10 by way of internal conductive traces 16 provided in the substrate 10. For example, as explained herein, the conductive traces 16 can include vertical and horizontal segments and provide electrical communication between the conductive lands 4 and contact pads 14 on the top surface 17 of the substrate 10, and/or between the conductive lands 4 and electrical leads 18 on the bottom surface of the substrate 10. The contact pads 14 can comprise exposed metallic pads for providing electrical communication (e.g., by bonding wires) between the substrate 10 and an integrated device die. The electrical leads 18 can comprise exposed metallic portions for providing electrical communication (e.g., by solder balls) between the substrate 10 and a system motherboard (not shown).

The cavity 9 can have a depth D and a width W. As explained in more detail below with respect to FIG. 1B, the depth D and width W can be selected to be large enough to receive and support an integrated device die. The depth D and cavity size can vary, depending on, e.g., the size of the die and stacking arrangements. For example, in some arrangements, the depth D of the cavity 9 can be in a range of about 0.3 mm to about 5 mm. The width W of the cavity 9 can be in a range of about 0.1 mm to about 35 mm.

FIG. 1B is a schematic side cross-sectional view of an integrated device package 1 that includes the substrate 10 of FIG. 1A. In the package 1 shown in FIG. 1B, a first integrated device die 2 can be disposed in the cavity 9. As shown in FIG. 1B, the first integrated device die 2 can be flip-chip mounted to the floor 15 of the cavity 9. For example, electrical contacts of the die 2 can electrically connect to the conductive lands 4 by way of one or more solder balls 6. Any other suitable manner of electrically coupling the die 2 to the lands 4 may be used. For example, in other embodiments, the die 2 can connect to the conductive lands 4 by way of anisotropic conductive film (ACF) or non-conductive paste (NCP) technologies. In other embodiments, however, the width and/or the depth of the cavity 9 may be larger than that shown in FIG. 1B such that the first die 2 may be wire bonded to the lands 4 in the cavity 9 without being positioned in a flip-chip arrangement, e.g., without being in an upside-down orientation relative to the floor 15 of the cavity 9.

The first integrated device die 2 can be any suitable type of device die, including, e.g., a microelectromechanical systems (MEMS) device die, an integrated circuit die, etc. In the embodiment shown in FIG. 1B, for example, the first integrated device die 2 is a MEMS device die having a protective cap 5. The MEMS die can be any suitable MEMS die, such as an inertial motion sensor die (e.g., an accelerometer, gyroscope, etc.), pressure sensor die, or other suitable type of die. The cap 5 can be provided to protect active components of the die 2, such as a mechanical beam or other structure incorporated in the MEMS die.

It should be appreciated that the first integrated device die 2 may be sensitive to stresses exerted on the die 2 by other components of the package 1 or the larger system. For example, in some other packages, a MEMS die (such as the device die 2) may be mounted on a substrate, and a molding material or encapsulant may be applied directly over and contacting the MEMS die. The encapsulant may exert stresses on the MEMS die, which may damage sensitive components, such as beams or other mechanical components of the die. For example, without being limited by theory, the encapsulant may include various amounts of moisture throughout the lifetime of the package, e.g., during assembly, transportation, operation, etc. As the amount of moisture in the encapsulant increases or decreases, epoxy resin in the encapsulant may swell or shrink to different extents at different regions, which exerts stresses against the die when the encapsulant contacts the die. The resulting damage to sensitive components may cause the device to degrade in performance, malfunction or fail. Temperature exposure and temperature cycling of the device without additional mechanical stress can also cause the device to degrade in performance, malfunction or fail. Although the stress-sensitive die disclosed herein is a MEMS die, in other arrangements, the sensitive device die can comprise any other stress-sensitive die, such as an integrated circuit die that has sensitive active components formed therein, for example bandgap reference circuits, converters, amplifiers, or voltage reference circuits. Accordingly, it can be advantageous to protect sensitive device dies from external stresses or forces.

In the embodiment of FIG. 1B, the first integrated device die 2 can be substantially protected or shielded from external stresses. As shown in FIG. 1B, a second integrated device die 3 can be attached to the top surface 17 of the substrate 10 and positioned over the cavity 9 such that the second integrated device die 3 covers the cavity 9. Thus, the second die 3 can cover substantially an entire opening that defines the cavity 9. As explained above, the cavity 9 can be dimensioned to have a width W slightly larger than a width of the first integrated device die 2. The depth D of the cavity can be dimensioned to be greater than or equal to a height of the first integrated device die 2. In the embodiment shown in FIG. 1B, for example, the second integrated device die 3 may be mounted just above the first integrated device die 2 such that a portion of the second die 3 rests upon a portion of the first die 2. In other embodiments, the first integrated device die 2 may positioned such that an upper portion of the die 2 is below and spaced apart from the second integrated device die 3.

The second integrated device die 3 can couple to the top surface 17 of the substrate 10 (and/or an upper portion of the first device die 2) by way of an attachment media 11, which may comprise an adhesive layer or double-sided tape. The attachment media 11 shown in FIG. 1B can extend across the width (or exceeding the width) of the second integrated device die 3. For example, applying the attachment media 11 across the width of the die 3 can improve the reliability of mechanical attachment of the die 3. In other embodiments, the attachment media 11 can be applied such that it covers only a portion of the bottom surface of the die 3. For example, in some embodiments, the attachment media 11 can be applied about a perimeter (or a portion of a perimeter) of the second integrated device die 3. The second integrated device die 3 and/or the attachment media 11 may act to substantially enclose and/or seal the cavity 9 from the outside environs. Thus, the first integrated device die 2 may be entirely disposed in the cavity 9 such that the cavity 9 (which may comprise air or a vacuum) prevents external stresses from being transmitted to the die 2. In addition, by flip-chip mounting the first integrated device die 2 to the substrate 10, the active components of the die 2 protected by the cap 5 may be further shielded from stresses by disposing the active components closer to the floor 15 of the cavity 9 than to the opening, which may be closer to sources of stress.

As shown in FIG. 1B, the second integrated device die 3 can electrically communicate with the substrate 10 by way of one or more wire bonds 7 that connect electrical contacts of the die 3 with the conductive contact pads 14 on the top surface 17 of the substrate. In some embodiments, the second integrated device die 3 can comprise a processor or integrated circuit device die, such as an Application Specific Integrated Circuit (ASIC) die. In such embodiments, the second integrated device die 3 can electrically communicate with the first integrated device die 2 and/or with the electrical leads 18 by way of the conductive traces 16. For example, in some embodiments, the second integrated device die 3 can receive signals from the first integrated device die 2 by way of the traces 16 and can process the signals for transmission to the system motherboard via the leads 18. In various embodiments, the second integrated device die 3 can also be used to electrically shield the first integrated device die 2. For example, the second device die 3 can be grounded to shield the first die 2. Although the second device die 3 is described as an integrated circuit or processor die, in other embodiments, the second integrated device die 3 can be another type of device die, such as a MEMS die, etc. In addition, although the cavity 9 is shown as being covered or sealed by an integrated device die, in other embodiments, the cavity 9 can be sealed with any other suitable component, such as a slug or plate of material (e.g., a silicon plate or cap acting as an interposer), a copper substrate, a ceramic substrate, a BT laminate or FR-4 board substrate. The cavity 9 can be sealed by any suitable electronic component that can electrically communicate with the substrate 10 and/or can be encapsulated.

As shown in FIG. 1B, a molding material or encapsulant 8 can be applied over the second integrated device die 3, bonding wires 7, and portions of the substrate 10 to protect the second die 3. At least because the first integrated device die 2 disposed in the cavity 9 is physically separated from and/or sealed from the encapsulant 8, stresses that may be generated in the encapsulant 8 are not transmitted to the first integrated device 2 and its sensitive components. As explained herein, the second integrated device die 3 can act to physically separate and/or seal the cavity 9 and the first device die 2 from the encapsulant 8, such that the encapsulant does not contact the first integrated device die 2 and/or active components thereof.

Thus, disposing the first integrated device die 2 in the cavity and sealing the cavity 9 with the second integrated device 3 (or another component) can protect the first integrated device die 2 (and its associated sensitive components) from external stresses, such as those generated by the encapsulant 8. Besides shielding the first device die 2 from external stresses, the embodiment of FIG. 1B can advantageously be assembled at reduced costs as compared to other solutions. For example, in other packaging arrangements, stress-sensitive dies may be mounted to a substrate and enclosed with a metal lid such that an air cavity is formed between the stress-sensitive die and the lid. However, in packages that utilize a lid and cavity, the materials used to form the lid (e.g., metals) may be more expensive than an encapsulant or molding material. Furthermore, solutions that utilize a lid and cavity entail individual placement of a lid for each package, whereas encapsulant can be applied simultaneously across an array of package substrates.

Accordingly, the embodiment shown in FIG. 1B can reduce assembly costs by using encapsulant to cover the second die 3 rather than covering the die 3 with an expensive lid process. Furthermore, the encapsulant can be used in conjunction with batch processing techniques to cover an array of multiple device dies with a layer of molding material or encapsulant. The array of device dies and encapsulant can subsequently be singulated to form separate, encapsulated device packages, such that the sides of the encapsulant 8 can be flush with the sides of the substrate 10, as shown. Skilled artisans would understand that processing multiple device dies at once can advantageously reduce costs. The use of such batch processing techniques with relatively inexpensive materials (such as molding materials)

can therefore enable the use of a package that shields stress-sensitive dies from external stresses at reduced costs as compared with other packages. In some embodiments, multiple dies can be disposed in or above the cavity 9. For example, a sensor die and a processor die can electrically communicate with one another in a side-by-side or stacked configuration. As an example, two or more dies can be disposed adjacent one another in the cavity 9. In some embodiments, two or more dies can be stacked on top of one another in a stacking relationship within the cavity 9. In some embodiments, multiple dies (e.g., stacked or disposed side-by-side) can be disposed over the cavity 9 to at least partially cover the cavity 9.

FIG. 2A is a schematic side cross-sectional view of a substrate 10 including a cavity 9 through a top surface 17 of the substrate 10 and having a lower portion 9A and an upper portion 9B, according to another embodiment. Unless otherwise noted, reference numerals in FIG. 2A correspond to components similar to or the same as similarly-numbered components of FIGS. 1A-1B. For example, as with the substrate 10 of FIGS. 1A-1B, the substrate 10 of FIG. 2A can comprise a PCB substrate with conductive contact pads 14 on the top surface 17 of the substrate 10, electrical leads 18 on the bottom surface of the substrate 10, and internal traces 16 to route signals through the substrate 10. However, unlike the embodiment of FIG. 1A, the cavity 9 can comprise a lower portion 9A and an upper portion 9B that is wider or larger than the lower portion 9A. For example, as shown in FIG. 2A, a ledge 13 can be defined or formed between or at the junction of the lower portion 9A and the upper portion 9B. As shown in FIG. 2A, the ledge 13 can comprise one or more exposed conductive lands 4 to provide communication with the contact pads 14 and/or the electrical leads 18 by way of the internal traces 16. The ledge 13 can be recessed from the top surface 17 of the substrate 10.

In some embodiments, the lower portion 9A can be defined (e.g., by milling and/or laser etching) to have a first width $W_1$, and the upper portion 9B can be defined (e.g., by milling and/or laser etching) to have a second width $W_2$ wider than the first width $W_1$. In some embodiments, an organic substrate can be used. For example, multiple laminate substrates (e.g., BT or FR-4 sheets) can be pressed and cured together to define the lower portion 9A and upper portion 9B. Some of the substrates may have window portions that help define the cavity when pressed together. In some embodiments, a ceramic substrate can be used and can be built up layer by layer to define the cavity 9. The first width $W_1$ can be defined to have a width sufficient to receive a width of an integrated device die. For example, the first width $W_1$ can be in a range of about 0.1 mm to 35 mm. The second width $W_2$ can be defined to have a width sufficient to accommodate wire bonds that electrically connect the die to the substrate 10 (see FIG. 2B). For example, the second width $W_2$ can be about 1 mm wider than $W_1$ in various embodiments. As with the embodiment of FIG. 1A, the cavity 9 can have a depth D sufficient to accommodate at least a height of a device die to be disposed in the cavity 9.

Figure 2B:
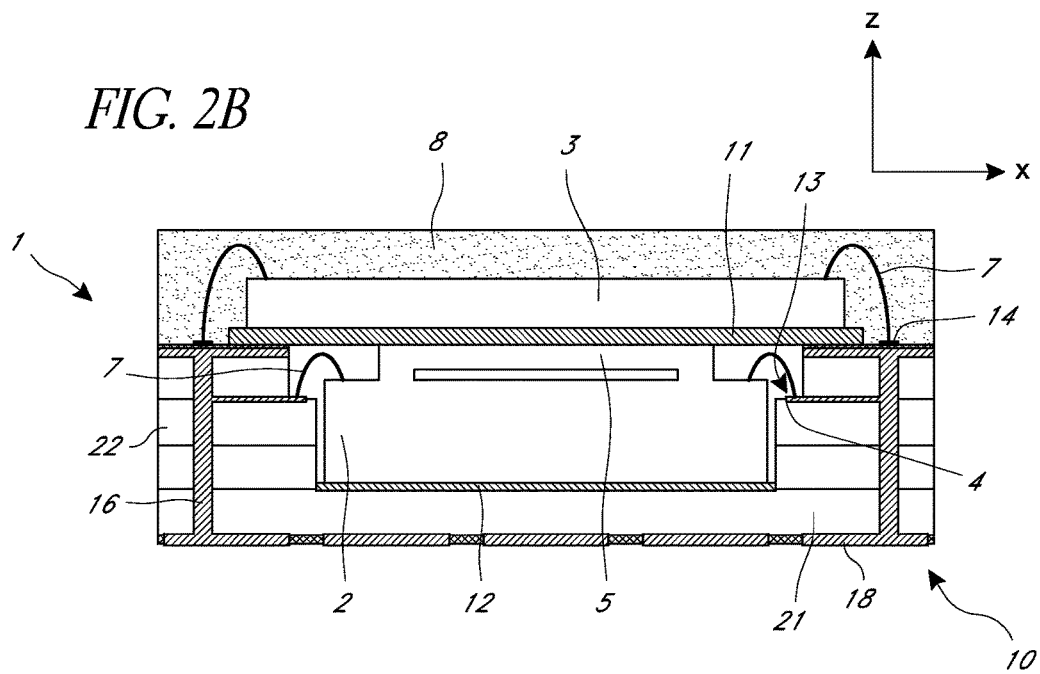
FIG. 2B is a schematic side cross-sectional view of an integrated device package that includes the substrate of FIG. 2A.

FIG. 2B is a schematic side cross-sectional view of an integrated device package 1 that includes the substrate 10 of FIG. 2A. Unless otherwise noted, reference numerals in FIG. 2B correspond to components similar to or the same as similarly-numbered components of FIGS. 1A-2A. For example, as with the package 1 of FIG. 1B, the package 1 of FIG. 2B includes a first integrated device die 2 and a second integrated device die 3. The first integrated device die 2 can be positioned in the cavity 9. The second integrated device die can be attached to the top surface 17 of the substrate 10 and positioned over the cavity 9 such that the second integrated device die 3 covers and/or seals the cavity 9 from the outside environs. As with the embodiment of FIG. 1B, in the arrangement of FIG. 2B, the second device die 3 can be wire bonded to contact pads 14 on the top surface 17 of the substrate 10, and a molding material or encapsulant 8 can be applied over the device die 3 and portions of the substrate 10. Attachment media 11 can be used to attach the second device die 3 to the substrate 10. In some embodiments, the attachment media can cover the entire width of the bottom surface of the device die 3. In other embodiments, the attachment media 11 can cover only a portion of the bottom surface of the device die 3, such as the perimeter or periphery of the device die 3.

Unlike the embodiment shown in FIG. 1B, however, in FIG. 2B, the first integrated device die 2 may be mounted such that the cap 5 is positioned near the opening of the cavity 9 in the upper portion 9B, rather than near the floor 15 of the cavity 9. For example, the first integrated device die 2 can be attached to the floor 15 by way of suitable attachment media 12, which may be similar to the attachment media 11 described herein. Further, the first device die 2 can electrically couple to the conductive lands 4 on the ledge 13 by way of bonding wires 7. As with the package of FIG. 1B, the first and second device dies 2, 3 can electrically communicate with one another and/or with the system motherboard by way of the internal traces 16.

Moreover, as with the embodiment of FIGS. 1A-1B, the package 1 shown in FIG. 2B can protect the first device die 2 from external stresses, e.g., stresses that may be generated in the encapsulant 8 or other system components. For example, as explained above, the first device die 2 can comprise a MEMS die having one or more sensitive active components. By sealing the first device die 2 in the cavity 9 and/or separating the sensitive active components from the encapsulant 8, the arrangement of FIG. 2B can advantageously protect the first device die 2 from external stresses. Further, as with the embodiment of FIGS. 1A-1B, the package 1 in FIG. 2B can be assembled at lower cost relative to other packages, such as those that utilize a lid and cavity and/or those that are assembled without using batch processing techniques.

Figure 3:
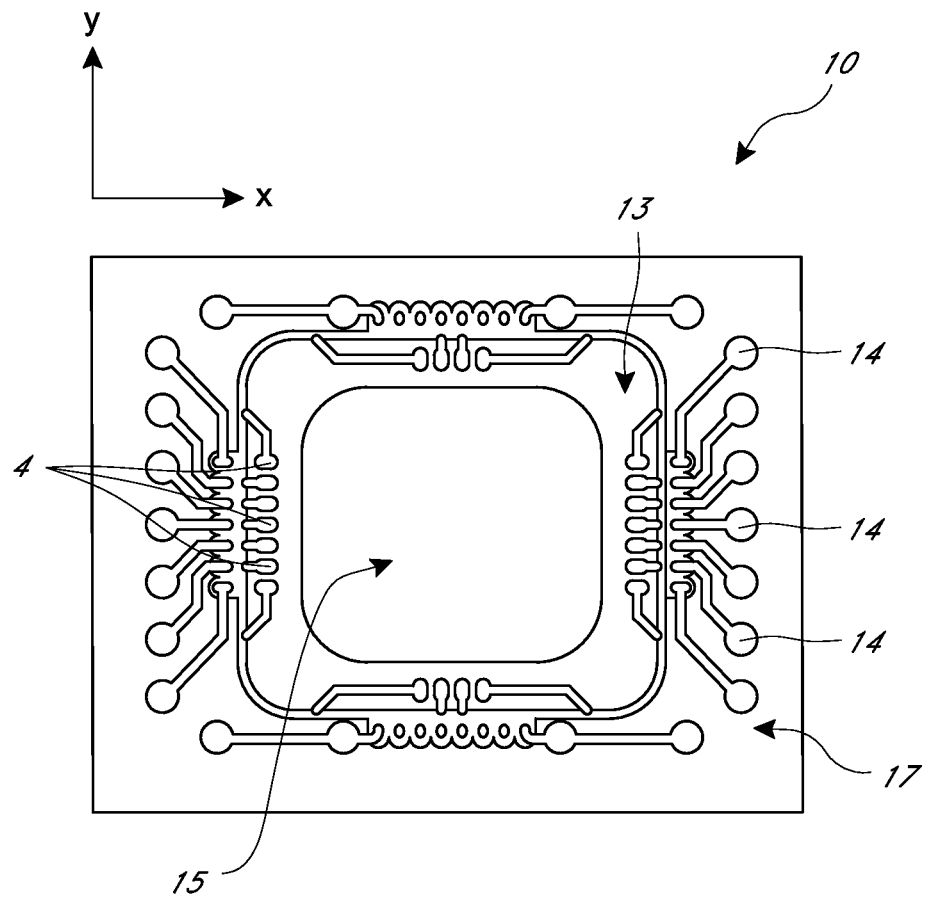
FIG. 3 is an image of a top plan view of the substrate of FIG. 2A.

FIG. 3 is an image of a top plan view of the substrate 10 of FIG. 2A. As shown in FIG. 3, the contact pads 14 on the top surface 17 of the substrate 10 can be arranged on opposing sides of the substrate 10. Similarly, the conductive lands 4 can be disposed on the ledge 13 within the cavity 9 on opposing sides of the cavity 9. In other embodiments, the contact pads 14 and/or lands 4 can be disposed along all sides of the substrate. FIG. 3 illustrates seven contact pads 14 and seven conductive lands 4 on each of two opposing sides of the substrate 10. However, it should be appreciated that any suitable number of contact pads 14 and lands 4 may be used.

Figure 4:
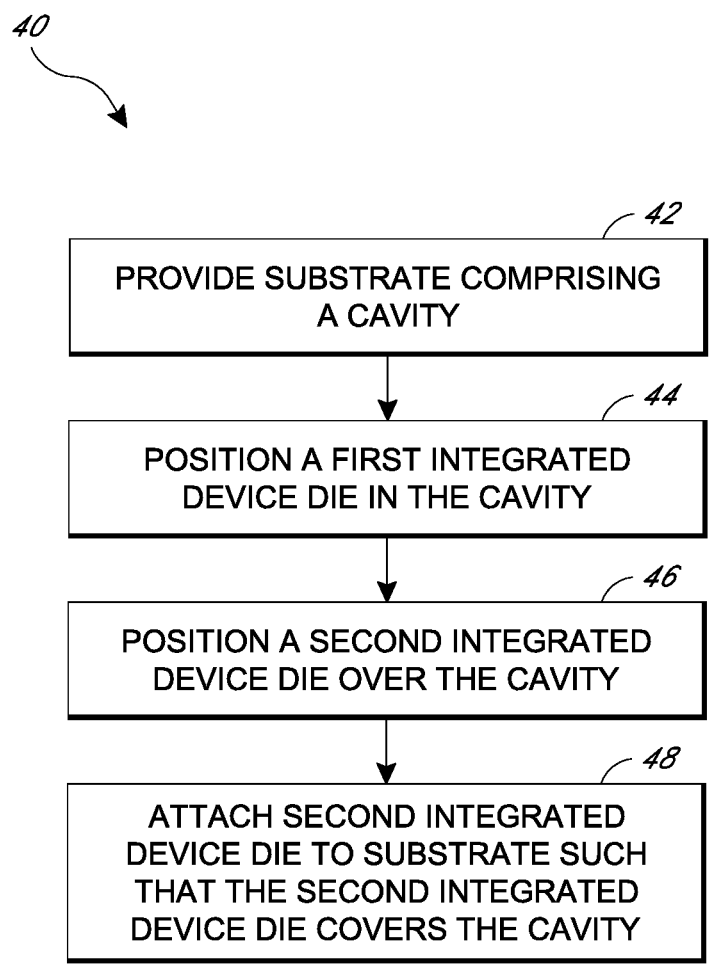
FIG. 4 is a flowchart illustrating a method for manufacturing an integrated device package, in accordance with one embodiment.

FIG. 4 is a flowchart illustrating a method 40 for manufacturing an integrated device package. The method 40 begins in a block 42, in which a substrate comprising a cavity is provided. As explained above, the substrate may comprise any suitable package substrate, such as a PCB substrate that includes internal conductive traces. The cavity can be formed or defined through a top surface of the substrate and can be dimensioned to receive an integrated device die. In some embodiments, the cavity can be defined at least in part by a base portion and one or more walls integrally extending from, attached or coupled to the base portion. For example, in some embodiments, material can be removed from the top surface of the substrate, e.g., by milling, etching, etc., to define the cavity. In other embodiments, multiple layers of substrates can be laminated or pressed together to define the cavity.

The cavity can include a floor, and one or more conductive lands can be exposed on the floor of the cavity. One or more electrical contact pads can be exposed on an upper surface of the substrate. One or more electrical leads can be provided on the bottom surface of the substrate for electrical communication with the system motherboard. Internal traces can provide electrical communication between and among the conductive lands, the contact pads, and/or the electrical leads. In some embodiments, the cavity includes an upper portion and a lower portion between which is disposed a ledge. The ledge can be recessed from the top surface of the substrate and can comprise one or more conductive lands.

In a block 44, a first integrated device die can be positioned in the cavity. The first integrated device die can be any suitable device die. For example, as explained herein, it can be advantageous to shield stress-sensitive device dies from external stresses. Examples of such stress-sensitive dies may include MEMS dies (such as motion sensor dies, pressure sensors, etc.), integrated circuit dies, etc. The first integrated device die can electrically communicate with the substrate in any suitable manner. For example, the first integrated device die can be flip-chip mounted to the floor of the cavity and electrically connected to conductive lands, e.g., by way of solder balls, conductive epoxy, copper pillar bumps, etc. In other arrangements, the first integrated device die can be wire bonded to conductive lands disposed on the floor of the cavity or on a ledge recessed from the top surface of the substrate.

Turning to a block 46, a second integrated device die is positioned over the cavity. The second integrated device die can be any suitable device die, such as a processor or integrated circuit die, a MEMS die, etc. In a block 48, the second integrated device die can be attached to the substrate such that the second integrated device die covers the cavity. For example, an attachment media (such as an adhesive, die attach film, or solder) may be used to attach the second integrated device die to the top surface of the substrate and/or to upper portions of the first integrated device die. The second integrated device die and/or the attachment media can act to seal the first integrated device die from the outside environs and external stresses. The second integrated device die can electrically communicate with the first integrated device die and/or an external motherboard in any suitable manner. For example, the second integrated device die can be wire bonded to contact pads of the substrate, which communicate with the first device die and/or the electrical leads by way of internal traces.

An encapsulant can then be molded or applied over the second integrated device die and portions of the substrate. Because the second integrated device die seals and/or separates the encapsulant or molding material from the first integrated device die, the encapsulant does not contact the first integrated device die, e.g., active components or sides of the first device die. The first integrated device die can accordingly be shielded from external stresses generated in the encapsulant or in other portions of the system. As explained above, although the method 40 of FIG. 4 describes the use of a second integrated device die to cover the cavity and shield the first integrated device die, it should be appreciated that other components (such as a plate or slug of material, for example, silicon) may be used to cover and/or seal the cavity.

Figure 5:
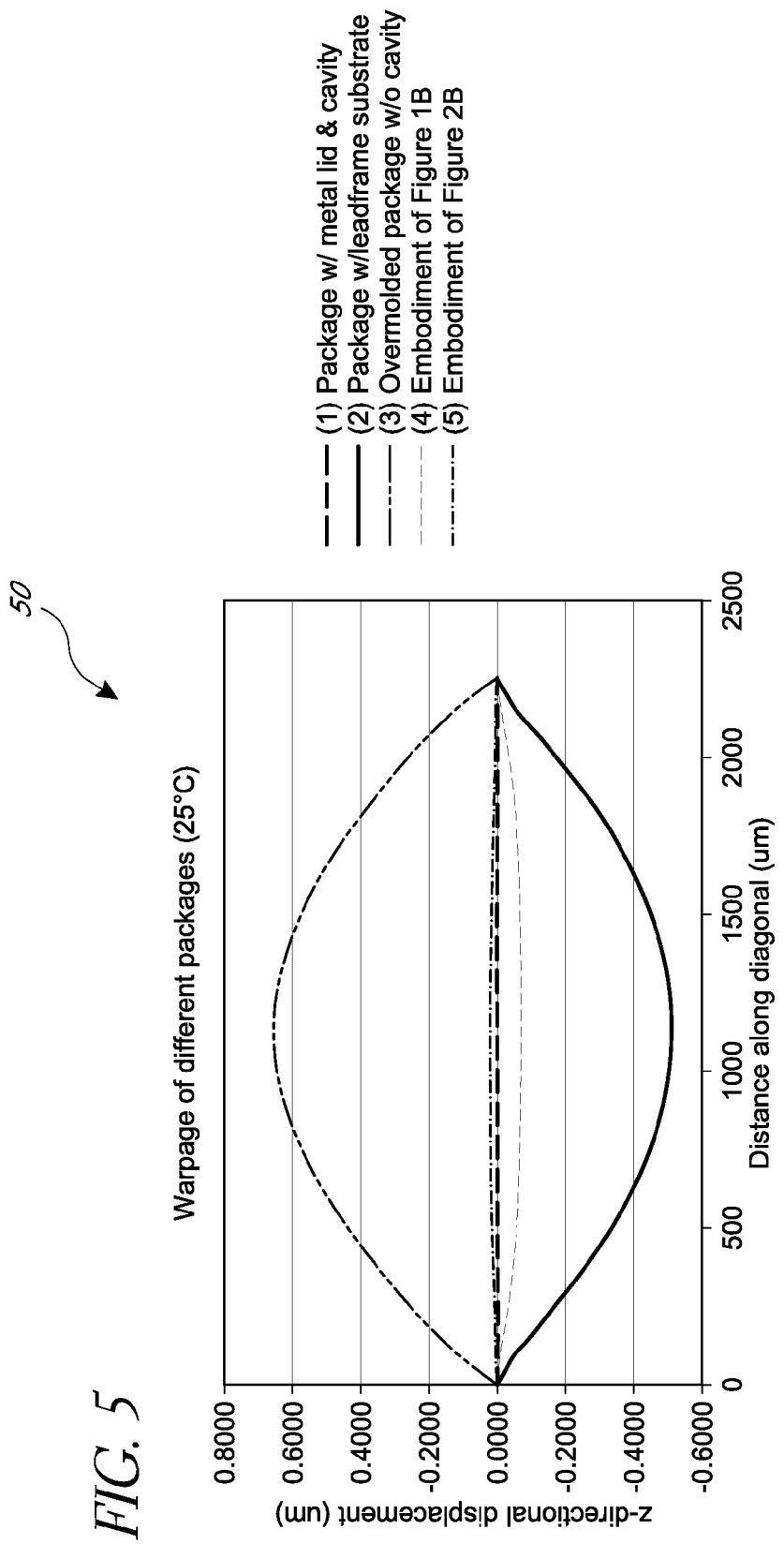
FIG. 5 is a chart illustrating simulations of warpage behavior of five different packages, including the embodiments of FIGS. 1B and 2B.

FIG. 5 is a chart 50 illustrating simulation results (i.e., finite element analysis, or FEA, results) comparing the warpage of various device packages. The vertical axis of FIG. 5 represents displacement of a packaged integrated device at a temperature of 25° C. The horizontal axis of FIG. 5 represents the distance along the diagonal of the device die. As shown in the legend of FIG. 5, the chart 50 measures z-direction displacement for five different packages, including: Package 1—a package that utilizes a metal lid and cavity with an organic or ceramic substrate, Package 2—a package that uses a leadframe substrate and an encapsulant over the die, Package 3—a package that uses a PCB substrate and an encapsulant over the die, Package 4—the package 1 shown in the embodiment of FIG. 1B, and Package 5—the package 1 shown in the embodiment of FIG. 2B.

As shown in FIG. 5, Package 4 (the embodiment of FIG. 1B) and Package 5 (the embodiment of FIG. 2B) cause minimal displacements in the device die. Indeed, the warpages of Package 2 (the overmolded leadframe package) and Package 3 (the overmolded PCB package) induce displacements that are much higher than the other packages, which may result in damage to the device dies or damage to functional performance due to stress changes over the life of product. Package 1 (the lid-cavity package) may induce relatively low displacements, but as explained above, packages that include a lid are more expensive that packages utilizing an encapsulant. Accordingly, the packages 1 of the disclosed embodiments can effectively shield stress-sensitive device dies 2 from external stresses at reduced costs as compared with other packages.

Figure 6:
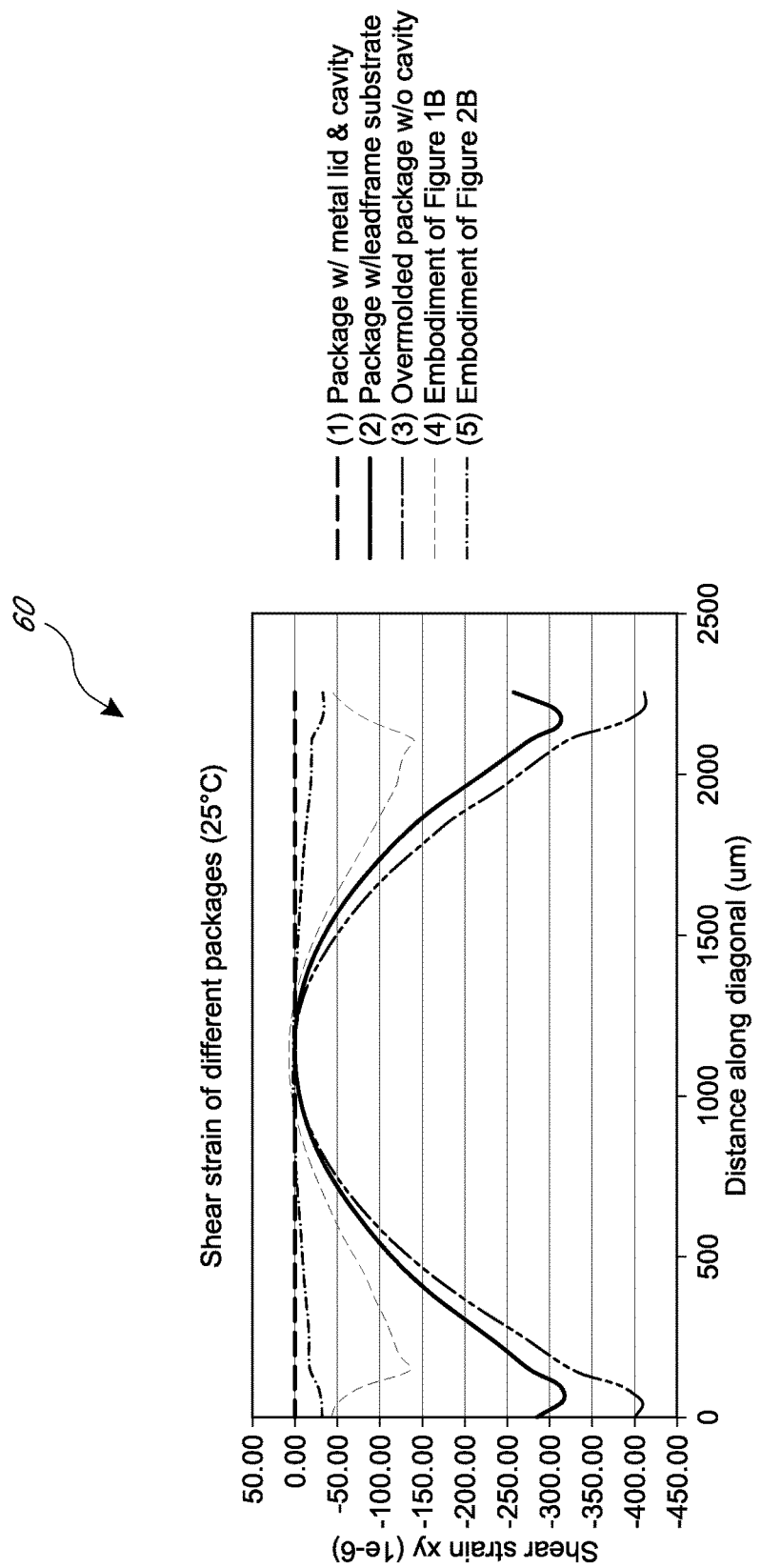
FIG. 6 is a chart illustrating simulations of shear strain induced by various device packages.

FIG. 6 is a chart 60 illustrating simulation results (i.e., FEA results) comparing the shear strain of various device packages at 25° C. The vertical axis of FIG. 6 represents shear strain in a packaged die, and the horizontal axis represents distance along the diagonal of the die. As expected from FIG. 5, Packages 2 (the overmolded leadframe package) and 3 (the overmolded PCB package) experience higher shear strains than the other packages. Package 1 (the lid-cavity package) may induce relatively low strains, but, as explained above, lid-cavity packages are typically assembled at relatively high costs. Packages 4 and 5 (corresponding to the packages 1 of FIGS. 1B and 2B) exhibit low strains and can be assembled at lower costs than Package 1.

Figure 7:
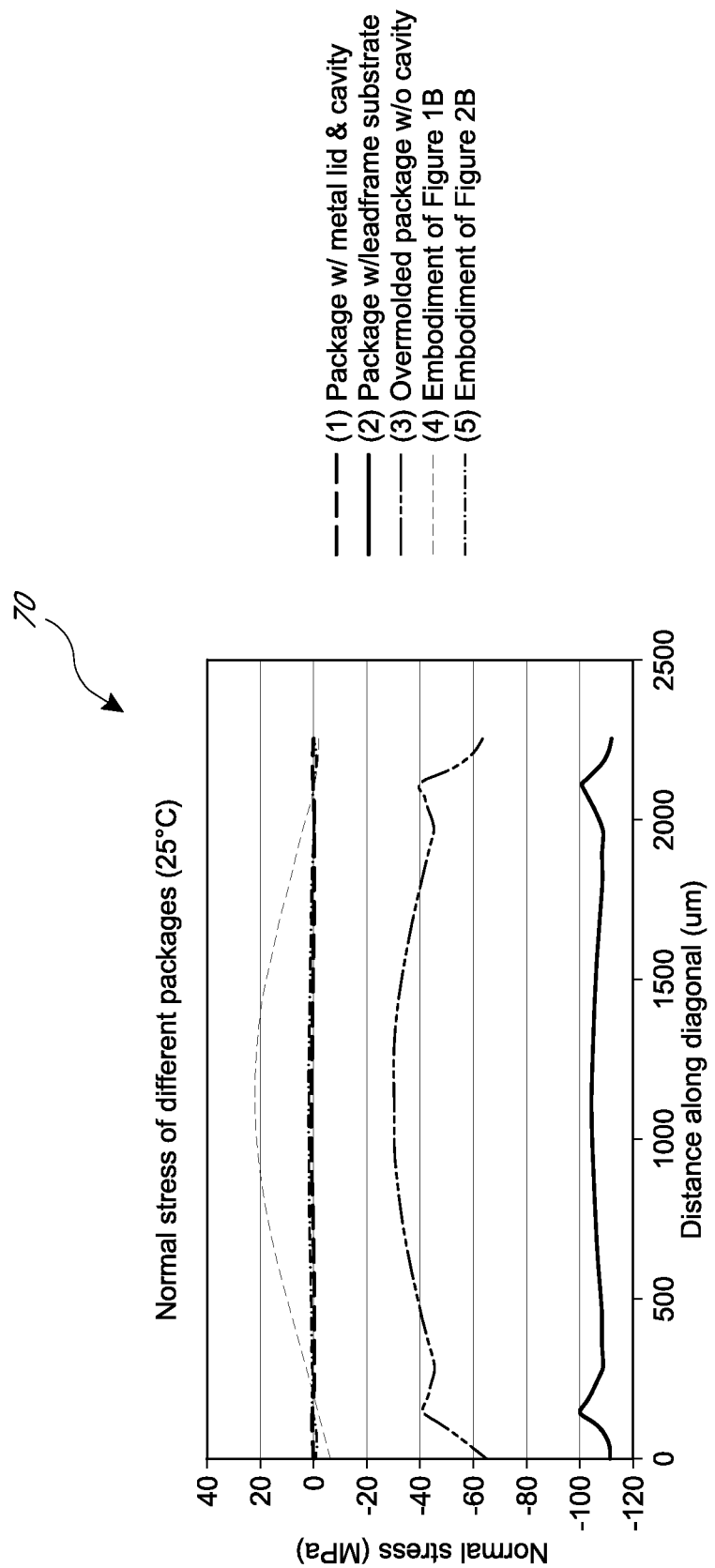
FIG. 7 is a chart illustrating simulations of normal stress induced by various device packages.

FIG. 7 is a chart 70 illustrating simulation results (i.e., FEA results) comparing the normal stress of various device packages at 25° C. The vertical axis of FIG. 7 represents normal stress, and the horizontal axis represents distance along the diagonal of the packaged die. Packages 2 and 3 exhibit normal stresses significantly higher than the other packages. Packages 1, 4, and 5 exhibit relatively low normal stresses. However, as explained above, the packages of FIGS. 1B and 2B (Packages 4 and 5) reduce stresses at lower costs as compared with Package 1.

Applications

Devices employing the above described schemes can be mounted into various electronic devices. Examples of the electronic devices can include, but are not limited to, consumer electronic products, parts of the consumer electronic products, electronic test equipment, etc. Examples of electronic products can include, but are not limited to, a gaming device, a mobile phone, a computer, a hand-held or tablet computer, a personal digital assistant (PDA), an automobile, a multi functional peripheral device, medical devices, etc. Further, the electronic device can include unfinished products.

Although disclosed in the context of certain preferred embodiments and examples, it will be understood by those skilled in the art that the principles and advantages taught herein extends beyond the specifically disclosed embodiments to other alternative embodiments and/or uses of the invention and obvious modifications and equivalents thereof. In addition, while several variations have been shown and described in detail, other modifications, which are within the scope of the present disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another. Thus, it is intended that the scope of the present invention herein disclosed should not be limited by the particular disclosed embodiments described above, but should be determined only by a fair reading of the claims that follow.

What is claimed is:

1. An integrated device package comprising:
   a package substrate comprising a cavity through a top surface of the package substrate;
   a first integrated device die positioned in the cavity, the first integrated device die comprising a microelectromechanical systems (MEMS) die having one or more active components, the first integrated device die electrically connected to one or more conductive lands disposed in the cavity;
   a second integrated device die attached to the top surface of the package substrate and positioned over the cavity, the second integrated device die comprising a processor die in electrical communication with the MEMS die, the second integrated device die covering the cavity and sealing the cavity from outside environs; and
   a ledge recessed from the top surface of the package substrate, the ledge comprising the one or more conductive lands, wherein the first integrated device die is electrically connected to the one or more conductive lands of the ledge.

2. The package of claim 1, further comprising an encapsulant over the second integrated device die and portions of the top surface of the package substrate.

3. The package of claim 2, wherein the cavity comprises air or a vacuum.

4. The package of claim 2, wherein the encapsulant is not disposed in the cavity.

5. The package of claim 1, wherein the first integrated device die is electrically connected to the package substrate.

6. The package of claim 5, wherein the first integrated device die is wire bonded to the one or more conductive lands of the ledge.

7. The package of claim 1, wherein the processor die is grounded to shield the MEMS die.

8. The package of claim 1, wherein the package substrate comprises a base portion and a wall extending transverse to the base portion, the wall formed with or attached to the base portion, the cavity defined at least in part by the base portion and the wall.

9. The package of claim 8, wherein the package substrate comprises a printed circuit board, the cavity comprising a recess in the printed circuit board.

10. The package of claim 1, further comprising a cap over the MEMS die, wherein the entire cap and the entire MEMS die are disposed within the cavity.

11. A method for manufacturing an integrated device package, the method comprising:
    providing a package substrate comprising a cavity through a top surface of the package substrate, the package substrate comprising a ledge recessed from the top surface of the package substrate, the ledge comprising one or more conductive lands;
    positioning a first integrated device die in the cavity, the first integrated device die comprising a microelectromechanical systems (MEMS) die having one or more active components;
    electrically connecting the first integrated device die with the one or more conductive lands of the ledge disposed in the cavity;
    positioning a second integrated device die over the cavity; and
    attaching the second integrated device die to the top surface of the package substrate to cover the cavity and to seal the cavity from outside environs,
    wherein the second integrated device die comprises a processor die in electrical communication with the MEMS die.

12. The method of claim 11, further comprising applying an encapsulant over the second integrated device die and portions of the top surface of the package substrate.

13. The method of claim 11, further comprising forming the ledge to be recessed from the top surface of the package substrate.

14. The method of claim 13, wherein electrically connecting the first integrated device die comprises wire bonding the first integrated device die to the one or more conductive lands of the ledge.

15. The method of claim 11, further comprising forming the cavity.

16. An integrated device package comprising:
    a package substrate comprising a cavity;
    a first integrated device die disposed in the cavity, the first integrated device die comprising a microelectromechanical systems (MEMS) die, the first integrated device die electrically connected to one or more conductive lands disposed in the cavity;
    an encapsulant over at least a portion of a top surface of the package substrate;
    a ledge recessed from the top surface of the package substrate, the ledge comprising the one or more conductive lands, wherein the first integrated device die is electrically connected to the one or more conductive lands of the ledge; and
    a component that seals the cavity, wherein the component that seals the cavity comprises a processor die in electrical communication with the MEMS die, and
    wherein the encapsulant does not contact at least an active side of the first integrated device die, and wherein the cavity and the first integrated device die are sealed from outside environs and the encapsulant.

17. The package of claim 16, wherein the processor die is attached to the top surface of the package substrate to seal the cavity.

18. The package of claim 16, wherein the first integrated device die is wire bonded to the one or more conductive lands of the ledge.

* * * * *